United States Patent
Muneshwar et al.

(10) Patent No.: US 10,619,243 B2
(45) Date of Patent: Apr. 14, 2020

(54) METHOD TO IMPROVE PRECURSOR UTILIZATION IN PULSED ATOMIC LAYER PROCESSES

(71) Applicants: Triratna P. Muneshwar, Edmonton (CA); Ken Cadien, Edmonton (CA)

(72) Inventors: Triratna P. Muneshwar, Edmonton (CA); Ken Cadien, Edmonton (CA)

(*) Notice: Subject to any disclaimer, the term of this patent is extended or adjusted under 35 U.S.C. 154(b) by 113 days.

(21) Appl. No.: 15/655,163

(22) Filed: Jul. 20, 2017

(65) Prior Publication Data
US 2018/0023195 A1 Jan. 25, 2018

Related U.S. Application Data

(60) Provisional application No. 62/365,951, filed on Jul. 22, 2016.

(51) Int. Cl.
| | | |
|---|---|---|
| C23C 16/44 | (2006.01) | |
| C23C 16/455 | (2006.01) | |
| C23C 16/52 | (2006.01) | |
| H01L 21/02 | (2006.01) | |
| H01L 21/285 | (2006.01) | |
| C23C 16/448 | (2006.01) | |

(52) U.S. Cl.
CPC .... C23C 16/45536 (2013.01); C23C 16/4482 (2013.01); C23C 16/45525 (2013.01); C23C 16/45546 (2013.01); C23C 16/45553 (2013.01); C23C 16/45593 (2013.01); C23C 16/52 (2013.01); H01L 21/0228 (2013.01); H01L 21/28556 (2013.01)

(58) Field of Classification Search
CPC ............ C23C 16/4481; C23C 16/4482; C23C 16/45525; H01L 21/0228; H01L 21/28556
See application file for complete search history.

(56) References Cited

U.S. PATENT DOCUMENTS

| | | |
|---|---|---|
| 4,058,430 A | 11/1977 | Suntola |
| 6,797,337 B2 | 9/2004 | Dando et al. |
| 6,941,963 B2 | 9/2005 | Maula et al. |
| 2004/0124131 A1 | 7/2004 | Aitchison et al. |
| 2005/0217575 A1 | 10/2005 | Gealy |
| 2005/0229969 A1 | 10/2005 | Nguyen et al. |
| 2006/0286775 A1* | 12/2006 | Singh .................. C23C 16/0227 438/478 |
| 2008/0041313 A1 | 2/2008 | Chen et al. |

(Continued)

OTHER PUBLICATIONS

Muneshwar, T. and Cadien, K., "AxBAxB . . . pulsed atomic layer deposition: Numerical growth model and experiments", Journal of Applied Physics (Feb. 2016), pp. 085306-1-085306-10, vol. 119, Issue 8, Copyright AIP Publishing LLC (2016); http://dx.doi.org/10.1063/1.4942439.

*Primary Examiner* — Matthew J Song
(74) *Attorney, Agent, or Firm* — Blue Filament Law PLLC (57) ABSTRACT

A method and system is provided to improve precursor utilization in pulsed atomic layer processes. The system integrates a chiller with a precursor ampoule to lower the temperature of the precursor ampoule, and thereby reduce the precursor vapor pressure. By lowering the ampoule temperature, the loss of excess unreacted precursor molecules is reduced, in order to improve precursor utilization efficiency in atomic layer processes.

11 Claims, 9 Drawing Sheets (56) References Cited

U.S. PATENT DOCUMENTS

| | | | |
|---|---|---|---|
| 2008/0149031 A1* | 6/2008 | Chu | C23C 16/4481 |
| | | | 118/726 |
| 2008/0299023 A1* | 12/2008 | May | B01D 7/00 |
| | | | 422/244 |
| 2009/0223451 A1* | 9/2009 | Kruger | C23C 16/4481 |
| | | | 118/723 VE |
| 2010/0117246 A1* | 5/2010 | Sarigiannis | C23C 16/4481 |
| | | | 261/22 |
| 2010/0209328 A1* | 8/2010 | Bi | B22F 1/0018 |
| | | | 423/344 |
| 2012/0216712 A1* | 8/2012 | Paranjpe | C23C 16/06 |
| | | | 106/287.18 |
| 2013/0319015 A1* | 12/2013 | Carlson | F25B 21/02 |
| | | | 62/3.6 |
| 2014/0137961 A1* | 5/2014 | Kao | H01L 21/67017 |
| | | | 137/561 R |
| 2014/0363978 A1* | 12/2014 | Martin | H01J 37/3053 |
| | | | 438/712 |
| 2017/0335450 A1* | 11/2017 | Collins | C23C 16/45512 |

* cited by examiner

METHOD TO IMPROVE PRECURSOR UTILIZATION IN PULSED ATOMIC LAYER PROCESSES

CROSS-REFERENCE TO RELATED APPLICATION

This application claims priority of U.S. Provisional Patent Application Ser. No. 62/365,951 filed Jul. 22, 2016, which is incorporated herein by reference.

FIELD OF THE INVENTION

The present invention in general relates to pulsed atomic layer processes (ALP) and in particular, to a method for improving precursor utilization efficiency in these processes.

BACKGROUND OF THE INVENTION

Atomic layer processes (ALP) are thin film fabrication techniques where the physical and/or chemical interactions occur at an atomic scale in discrete steps. Atomic layer deposition and atomic layer etching are examples of atomic layer processes that are used for controlled material growth and controlled etching of material, respectively.

The atomic layer deposition (ALD) technique, formerly known as atomic layer epitaxy, is widely used in semiconductor fabrication and other related industries for deposition of oxides ($TiO_2$, $HfO_2$, $ZrO_2$, $SiO_2$, etc.), nitrides (TiN, HfN, ZrN, SiN, etc.), and other compound thin films. The ALD technique has also been used for deposition of organic materials or organic-inorganic hybrid materials, where ALD is referred to as molecular layer deposition, or molecular layer epitaxy.

The atomic layer etching (ALE) technique is relatively recent as compared to ALD, but is considered to be a most promising etching process in fabrication of sub-10 nm semiconductor devices.

Typically, an ALP process may involve one or more precursors, where each precursor is sequentially pulsed into a process reactor, and thereby onto a substrate, whereon the precursor species undergoes a respective surface reaction. In order to ensure a precursor reaction proceeds until saturation, an exceedingly large number of precursor molecules are introduced in each pulse.

Figure 1:
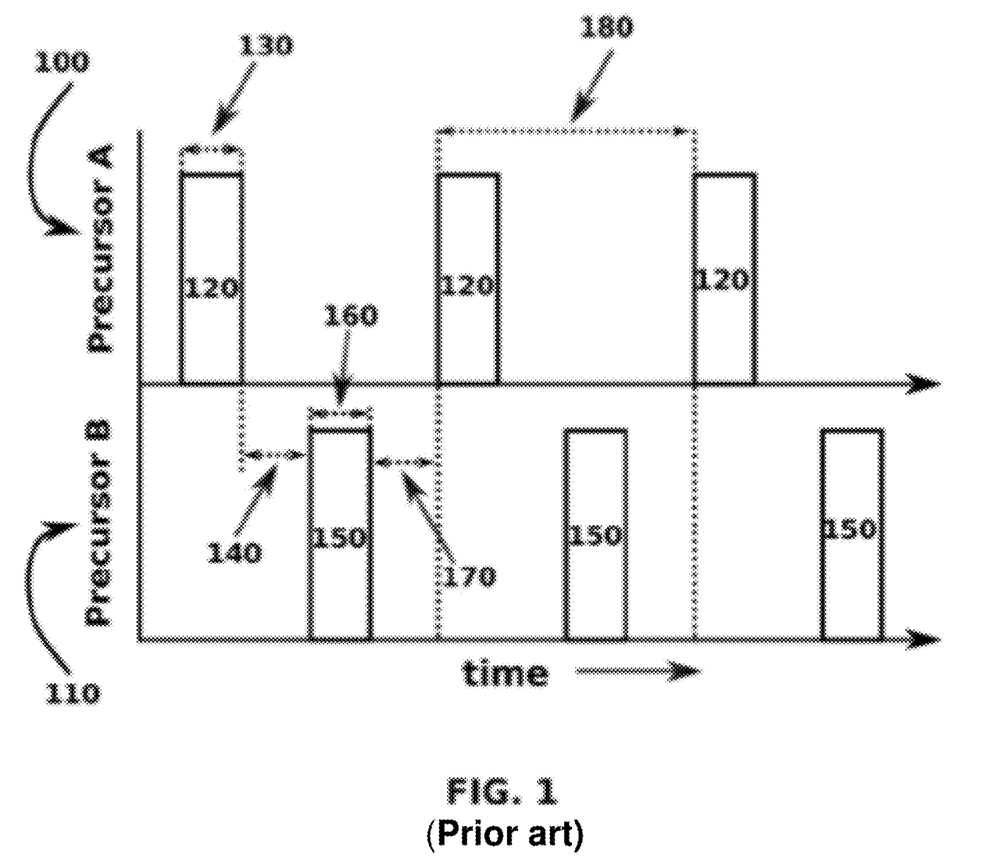
FIG. 1 illustrates a typical precursor pulsing sequence for a prior art atomic layer process using two-precursors.

FIG. 1 illustrates a typical ALP process using two precursors, precursor-A 100 and precursor-B 110, where the precursors (100, 110) are introduced into a process reactor as discrete pulses. As shown, during the process, the precursor-A 100 is released into the process reactor as pulse-A 120 of duration 130 followed by an inert gas purge or reactor evacuation for duration 140. Similarly, the second precursor-B 110 is released into the reactor as pulse-B 150 of duration 160 also followed by an inert purge or reactor evacuation for duration 170. The precursor pulses (120, 150) and the intermittent inert gas purges or reactor evacuation steps (140, 170) constitute a "process cycle" with a total cycle-duration of 180. The process cycle is referred to as a "deposition cycle" in ALD, and as an "etching cycle" in the case of ALE. The pulse durations (130, 160) are kept excessively long in order that the reaction of precursors (100, 110) at the substrate attains a self-limiting surface saturation condition. In addition, the purge or reactor evacuation durations (140, 170) are required to be sufficiently long enough to ensure excess un-reacted precursor molecules from pulses (120, 150) along with the by-products of their respective surface reactions are totally pumped out of the process reactor.

The fundamental self-limiting characteristics of ALP processes ensure uniform precursor reactions over large area substrates. Furthermore, as these surface reactions occur at the atomic scale, ALP processes may be precisely controlled with the number of "process cycles". These exceptional features make ALP processes an indispensable technique for fabrication of critical features in semiconductor devices and related applications. For example, ALD films are highly uniform in thickness, exhibit excellent step-coverage within high-aspect ratio non-planar features, and the "growth per deposition cycle" in range of 0.01-0.10 nanometers/cycle enables for a thickness control within ±0.10 nanometers.

Although ALP processes exhibit several advantages over other thin film processing techniques, the efficiency ($\eta$) of precursor utilization, defined as the ratio of the number of precursor molecules involved in ALP surface reactions to the total number of precursor molecules pulsed into the reactor, remains a major concern. Since the ALP surface reactions are self-limiting or self-terminating, excess precursor molecules are pumped out of the reactor as waste, which results in poor precursor utilization efficiency. The poor precursor utilization efficiency $\eta$ of the ALP process directly translates into high operation-costs, since the cost of electronic grade high-purity precursors is expensive and is a major component of the process.

Figure 2A:
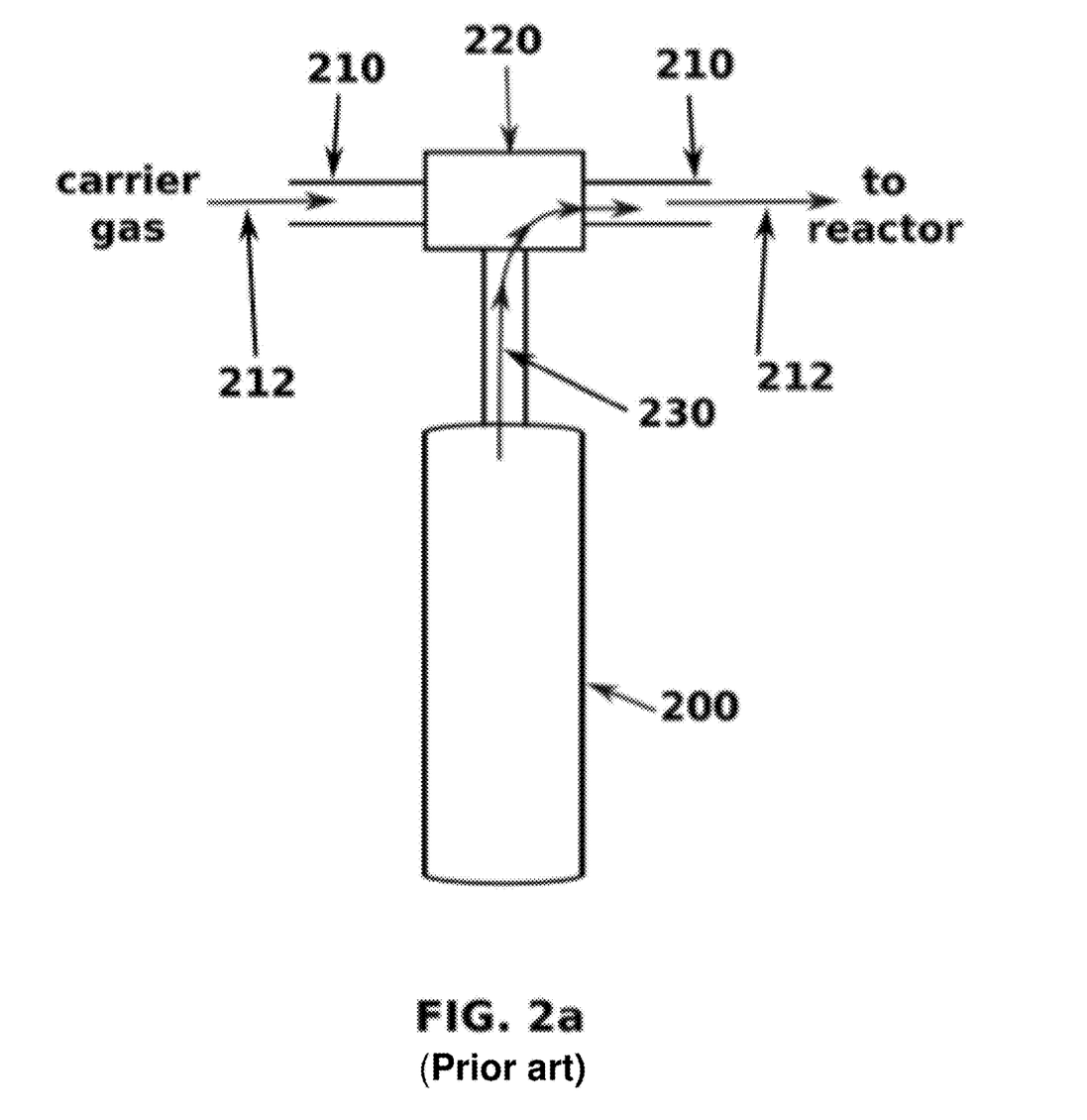
FIG. 2a illustrates an example of a prior art effusion-mode precursor delivery system where the precursor molecules effuse out of the precursor ampoule and into the precursor delivery line during a precursor pulse.
Figure 2B:
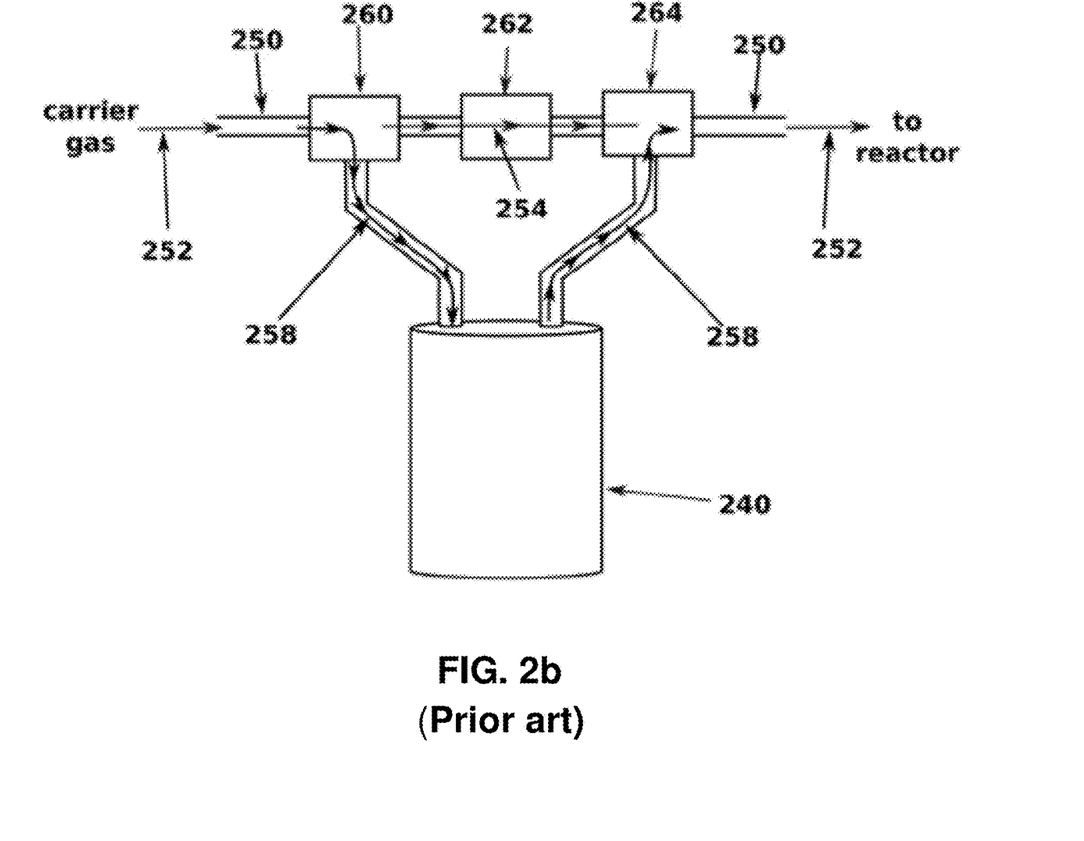
FIG. 2b illustrates an example of a prior art displacement-mode precursor delivery system where the inert carrier gas displaces the precursor vapor from precursor ampoule and into the precursor delivery line during precursor pulse.

FIGS. 2a and 2b illustrate examples of an effusion-mode and a displacement-mode of precursor delivery systems, respectively, as used in prior art ALP processes.

In the effusion-mode precursor delivery system as shown in FIG. 2a, a precursor ampoule 200 is installed onto the precursor delivery line 210 through a three-port valve 220. In the OFF state, the valve 220 restricts the precursor flow 230 into the carrier gas stream 212 flowing into the ALP process reactor. Over a precursor pulse duration, when the valve 230 is switched to the ON state (as shown), the effusion of precursor molecules from ampoule 200, results in precursor flow 230 into the carrier gas stream 212, and the released precursor molecules are delivered to the ALP reactor.

In the displacement-mode precursor delivery system as shown in FIG. 2b, the precursor ampoule 240 is installed onto the precursor delivery line 250 by two three-port valves (260, 264), and the delivery line 250 is further equipped with a bypass valve 262. If valves 260 and 264 are turned OFF and valve 262 is turned ON, carrier gas flow 252, is constrained to the flow-path 254 thereby restricting flow of precursor molecules into the reactor. However, when the valves 260, and 264 are turned ON and valve 262 is turned OFF, the carrier gas flow 252 follows the flow-path 258 where the carrier gas displaces the precursor vapor from ampoule 240 into the delivery line 250, and these displaced precursor molecules are then delivered into the ALP process reactor.

The rate at which precursor molecules are delivered into the reactor during a precursor pulse, depends upon the precursor vapor pressure within the ampoule, which further depends upon the ampoule temperature. In prior art ALP processes, in order to attain the characteristic self-limiting surface saturation condition within practically short times, the precursor ampoule(s) are typically maintained at ambient (or room) or elevated temperatures.

Furthermore, in prior art ALP processes, in order to improve precursor utilization efficiency, the precursor pulses shown as 120 and 150 in FIG. 1, are made short by reducing their respective pulse duration 130 and 160. In the prior art ALP reactors, the precursor molecules could be delivered as a pulse of ≤10 milliseconds using fast-switching valves shown as 220 in FIGS. 2a and 260, 262, 264 in FIG. 2b. However, shortening precursor pulses adversely affects the residence time of the pulsed precursor molecules within the ALP reactor. For example, in the prior art self-limiting ALD process reactor, precursor utilization efficiency (η) is typically approximately 0.01 (or 1%).

The increasing application of ALP processes in the semiconductor industry has increased the need for methods to improve utilization efficiency of high-purity precursors. Thus, there exists a need for alternative strategies for significantly improving precursor utilization efficiency in ALP processes, to make ALP techniques more acceptable in large volume fabrication.

SUMMARY OF THE INVENTION

A method is provided for efficient precursor utilization in an atomic layer, the process includes lowering the temperature of a precursor ampoule, and delivering precursor molecules from the precursor ampoule at the lower temperature into an atomic layer process reactor.

A precursor delivery system is provided that includes a chiller enclosing a precursor ampoule, and a fast switching valve in fluid communication with the precursor ampoule and a precursor delivery line.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE PREFERRED EMBODIMENTS

The present invention has utility as a precursor delivery method for efficient precursor utilization in atomic layer processes (ALP). Embodiments of the present invention provide a method for efficient precursor utilization in atomic layer processes (ALP), by lowering the vapor pressure of the precursor contained in an ampoule, achieved upon lowering the temperature of the ampoule. Embodiments of the present invention integrate a chiller onto the precursor ampoule, to lower the temperature of the precursor ampoule.

Embodiments of the present invention may be useful for other pulsed thin film processes illustratively including pulsed chemical vapor deposition (Pulsed-CVD), and pulsed metal-organic chemical vapor deposition ("Pulsed-MOCVD"), as well as for similar processes which involve delivery of precursor vapor from the ampoule to the substrate illustratively including chemical vapor deposition (CVD), metal-organic chemical vapor deposition (MOCVD), and other deposition methods. Furthermore, embodiments of the present invention may be useful for the introduction of dopants in ALD grown films, illustratively including Al-doped ZnO ALD films, and others.

In the following description, examples of precursor delivery system in effusion-mode and displacement-mode are discussed to provide an understanding of embodiments of the present invention. However, it will be obvious to one skilled in the art of thin film processing techniques that the present invention is not limited to the described examples of precursor delivery method. Detailed description on adaptation of present invention with other well-known precursor delivery methods have been avoided to prevent unnecessary obscuring of the present invention.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

It should be noted that the illustrated example of precursor delivery method only describes the delivery of precursor molecules from ampoule into the delivery lines and does not cover the transport of the precursor molecules onto the substrate surface within the reactor. Embodiments of the present invention may be practiced in conjunction with other techniques currently used to achieve high precursor utilization efficiency within the reactor. The figures representing components of the present invention are not drawn to scale, but instead are drawn to illustrate important features of the present invention.

As used herein, a substrate in the described ALP process refers to a planar or non-planar surface, enclosed by the reactor, in which the precursor molecules undergo respective self-limiting surface reactions. The substrate may be a stationary or a moving surface of a metal, semiconductor; an insulator in pure, alloyed, or doped form; a flexible or stiff polymer coated with one or more layers of organic or inorganic molecules; organic or inorganic nanostructures, or other substrates consisting of a continuous layer or discrete surface structures incorporating one or more material layers. It is appreciated that the ALP process may include an AxBAxB . . . pulsed or AxByAxBy . . . pulsed atomic layer process.

As used herein, a reactor includes reactors that may incorporate one or more features, and are not limited to, a static vacuum reactor, a continuous flow reactor with a cross-flow, or a showerhead configuration, hot wall reactor, a cold-wall reactor, a single substrate reactors, a batch reactor, a uniform precursor flow reactor, spatial precursor flow reactor, or a roll-to-roll process reactor.

As used herein a reactor may be a controlled enclosure accommodating one or more substrates for deposition. It is appreciated that forms of plasma may also be used in the reactor to assist the atomic layer process. It is appreciated that forms of the atomic layer process is assisted by photo-excitation As used herein a chiller may illustratively include a temperature controlled loop circulating a cold liquid or cold gas, a heat sink, or a cold bath.

As used herein, a precursor delivery system may include transport of precursor molecules from the ampoule onto the substrate, with or without using an inert carrier gas.

As used herein, a precursor is a reactant species being used with the ALP process that may be a metal and/or non-metal containing species, in a solid or liquid or gaseous form, which may be a monomer or a polymer, with or without ligand(s), where the ligands may be classified as inorganic or organic fragments. The precursor may be in the chemically pure form or a mixture of two or more precursors.

As used herein, an ampoule may include apparatus containing precursor bulk, as an individual container or an assembly incorporating two or more containers, each holding one or more precursors.

As used herein, a valve may include a two-port or a multi-port diaphragm valve, and other assemblies incorporating one or more types of valves with the ability to release a controlled number of precursor molecules in a gaseous form (or as vapor) from an ampoule into the precursor delivery lines, during a precursor pulse. It is appreciated that the valve may be a fast switching valve.

Embodiments of the present invention provide a precursor delivery method to increase the efficiency of precursor utilization in atomic layer process (ALP) techniques, where the ampoule containing the precursor bulk has a chiller in order to lower the temperature of the ampoule. By lowering the ampoule temperature, the vapor pressure of the precursor within the ampoule is lowered, which reduces the number of precursor molecules that are released into the delivery line, through the valve, during a precursor pulse.

As stated previously in the background of invention, ALP processes are important in semiconductor device fabrication and may be applicable in other related industries over other thin film deposition techniques. Since ALP surface reactions are self-limiting in nature, beyond saturation of a substrate surface with reacting precursor molecules, excess precursor molecules pulsed into the reactor do not participate in further reaction, and are pumped out of the reactor as waste. The poor precursor utilization efficiency in the prior art ALP processes is a serious limitation with application of ALP technique in large-volume fabrication.

In order to improve precursor utilization efficiency, embodiments of the present invention lower the temperature of the precursor ampoule during the ALP process. The intentional cooling of the precursor ampoule to a temperature below ambient (or room) temperature, lowers the precursor vapor pressure within the ampoule. At a lower precursor vapor pressure, the number of precursor molecules pulsed into the process reactor is lowered. As stated in the background of invention, prior art ALP processes are performed with precursor ampoule(s) maintained at ambient (or room) temperature or at an elevated temperature that introduce precursor molecules in an exceedingly large number into the process reactor to attain a self-limiting saturation condition at the substrate surface. One existing approach to reduce precursor waste, and thereby improve precursor utilization efficiency, is to introduce a lower number of precursor molecules into the process reactor using extremely short precursor pulses, however, this short pulsing reduces the average residence time of precursor molecules within the reactor. Embodiments of the present invention integrate a chiller with the precursor ampoule to lower the temperature of the ampoule below ambient or room temperatures, thereby reducing the number of precursor molecules delivered into a process reactor to a sufficient number for self-limiting ALP surface reactions. Embodiments of the present invention, therefore, reduces the number of precursor molecules lost as waste, in order to improve precursor utilization efficiency.

Figure 3A:
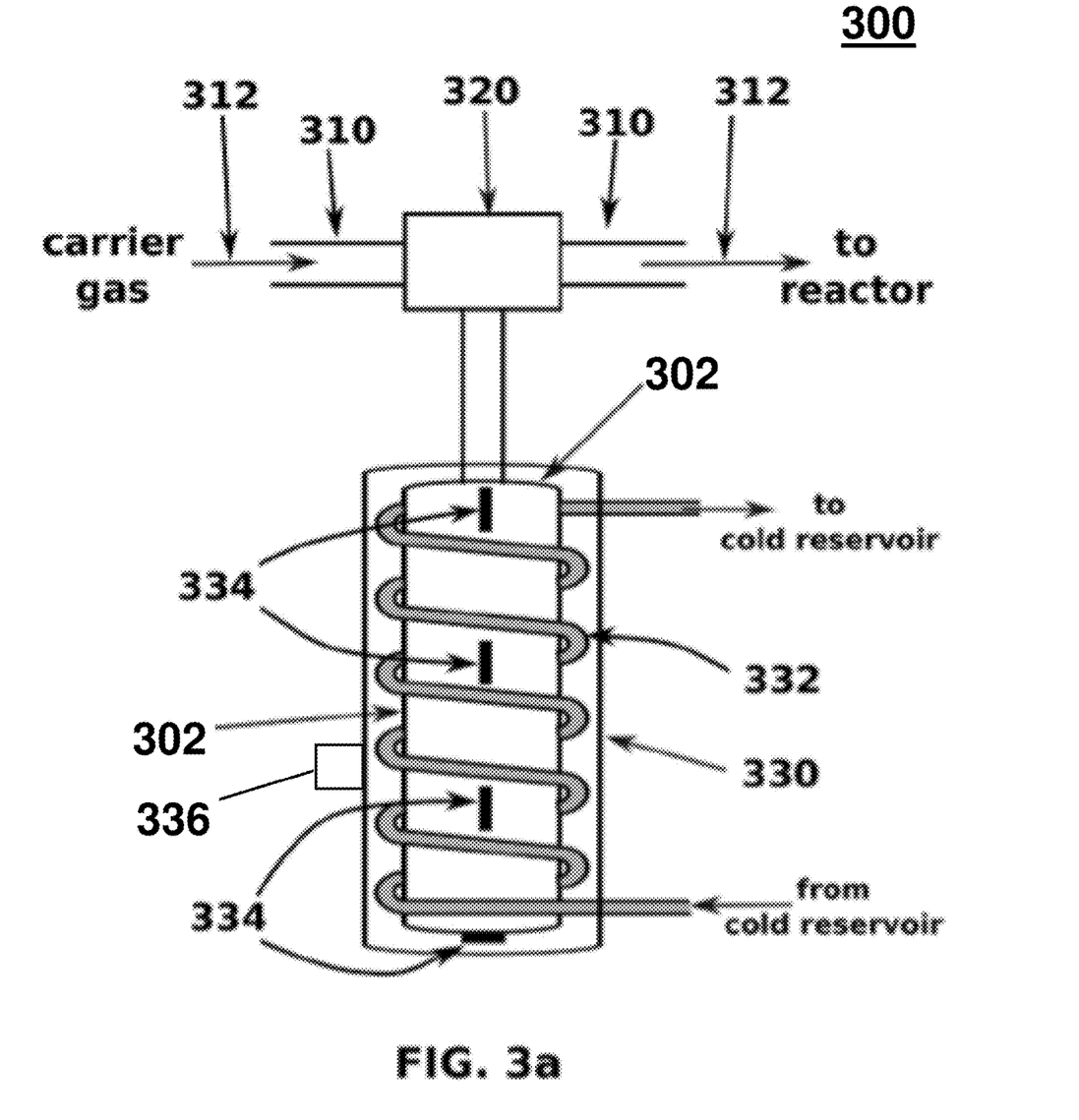
FIG. 3a illustrates an effusion-mode precursor delivery system having a chiller integrated with the precursor ampoule in accordance with an embodiment of the invention.

Referring now to the figures, FIG. 3a illustrates an inventive embodiment of an effusion-mode precursor delivery system 300. As shown in FIG. 3a, the ampoule 302 is connected to the precursor delivery line 310 through a three-port valve 320. The precursor ampoule 302 is enclosed in a chiller 330, to lower the temperature of ampoule 302 below the ambient temperature. The chiller 330 has a temperature controlled loop 332 circulating cold liquid or gas from a temperature controlled cold reservoir. The temperature controlled loop 332 may be in contact or in proximity with the ampoule 302. The chiller 330 may have, one or more, temperature sensing elements 334 in contact or in proximity with the ampoule 302, to provide real-time feedback to a temperature controller 336. The lowered temperature of the ampoule 302, decreases the vapor pressure of the precursor contained within the ampoule 302. The lowered precursor vapor pressure decreases the rate at which the precursor molecules effuse from ampoule 302 through the three-port valve 320 into the precursor delivery line 310 during the precursor pulse. The lowered temperature of ampoule 302 reduces the number of precursor molecules released into the carrier gas stream 312, thereby using a moderately short precursor pulse. The reduced number of precursor molecules delivered into the reactor, at the lower ampoule temperature, lowers the number of unreacted precursor molecules that are pumped out of the process reactor as waste, and thereby improves precursor utilization efficiency.

Figure 3B:
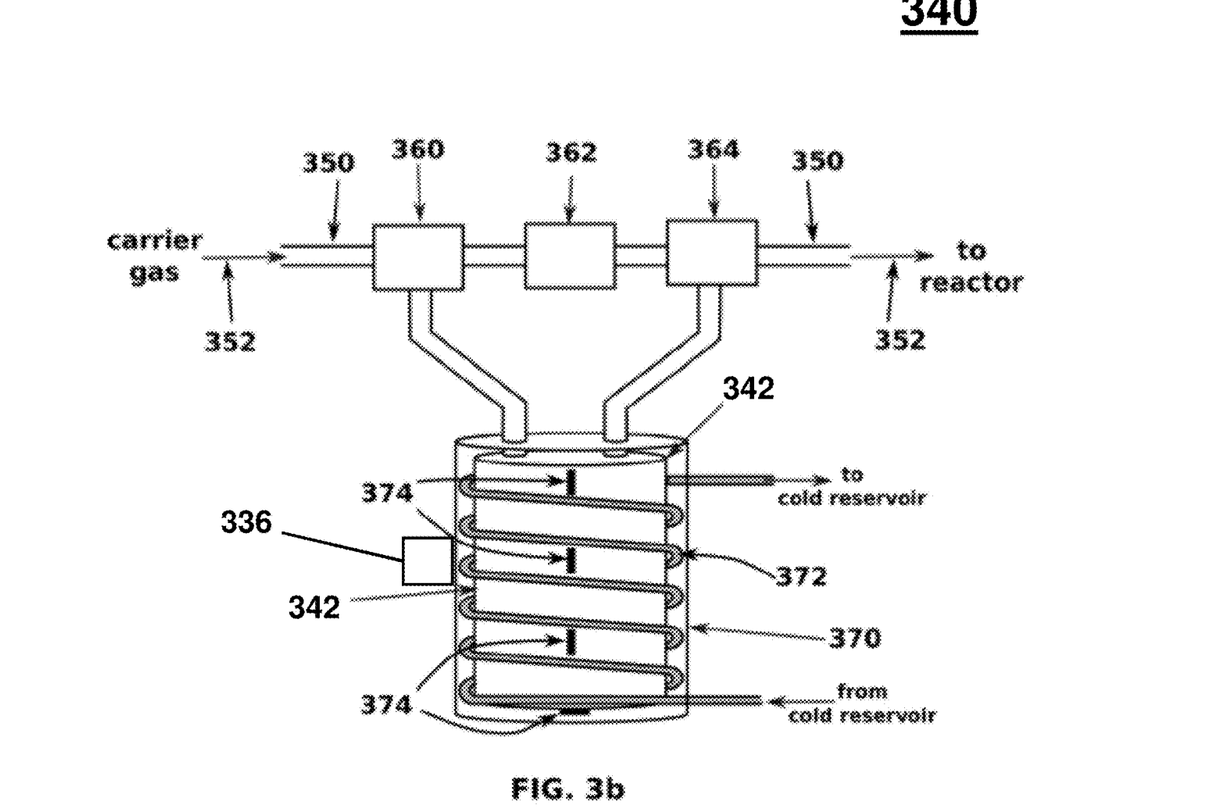
FIG. 3b illustrates a displacement-mode precursor delivery system having a chiller integrated with the precursor ampoule in accordance with an embodiment of the invention.

FIG. 3b illustrates an inventive embodiment of a displacement-mode precursor delivery system 340. As shown in FIG. 3b, the ampoule 342, is connected to a precursor delivery line 350, through two separate three-port valves (360, 364), and the delivery line 350 is further equipped with a bypass valve 362. The precursor ampoule 342 is enclosed in a chiller 370 that is used to lower the temperature of ampoule 342 below an ambient temperature. The chiller 370 has a temperature controlled loop 372 circulating cold liquid or gas from a temperature controlled cold reservoir. The temperature controlled loop 372 may be in contact or in proximity with the ampoule 342. The chiller 370 may have, one or more, temperature sensing elements 374 in contact or in proximity with the ampoule 342, to provide real-time feedback to a temperature controller 336. The lowered temperature of the ampoule 342 decreases the vapor pressure of the precursor contained within the ampoule 342. The lowered precursor vapor pressure, decreases the number of precursor molecules in the gas phase above precursor bulk within the ampoule 342. With the reduced number of gas phase precursor molecules, the number of precursor molecules displaced by the carrier gas from ampoule 342 into the precursor delivery line 350 during a precursor pulse is reduced. The lowered temperature of ampoule 342 results in a reduction in the number of precursor molecules released into the carrier gas stream 352, using a moderately short precursor pulse. The reduced number of precursor molecules delivered into the reactor, at the lower ampoule temperature, lowers the number of unreacted precursor molecules that are pumped out of the process reactor as waste, and thereby improves the precursor utilization efficiency.

In a specific embodiment of a silicon nitride atomic layer deposition using a tris-dimethylamino silane precursor, lowering ampoule temperature from approximately 25° C. to approximately 5° C., increases the precursor utilization efficiency η by a factor of 5×.

In a specific embodiment of a zinc oxide atomic layer deposition using diethyl zinc precursor, lowering ampoule temperature from approximately 25° C. to approximately 5° C., increases the precursor utilization efficiency η by a factor of 10.5×.

In a specific embodiment of an aluminum oxide atomic layer deposition using a trimethyl aluminum precursor, lowering ampoule temperature from approximately 25° C. to approximately 5° C., increases the precursor utilization efficiency η by a factor of 4.5×.

An additional benefit of having a chiller cooling a precursor ampoule in embodiments of the invention is that the lowered temperature of the ampoule slows down the degradation of the temperature sensitive precursors, and allows for loading a larger amount of precursor within the ampoule. In the prior art ALP processes with the ampoule maintained at an ambient or elevated temperature, loading of temperature sensitive precursor in the ampoule was restricted to a small quantity and it was necessary to physically refill the ampoule upon consumption of this small quantity of precursor with an increased frequency as compared to the chilled ampoules in embodiments of the invention.

A further benefit of having a chiller cooling a precursor ampoule in embodiments of the invention is that the lowered ampoule temperature enables the use of certain precursors, which are otherwise unstable at ambient or elevated temperatures. In prior art ALP processes with an ampoule maintained at ambient or elevated temperatures, the choice in precursors was restricted to the precursors that were stable at that precursor temperature.

It is appreciated that while in the examples of the present invention as depicted in FIG. 3a and FIG. 3b the chiller consists of a temperature controlled loop of a circulating cold liquid or gas, other methods and apparatus for lowering the temperature of the precursor ampoule may be used in place of or in conjunction with the chiller. For example, the precursor ampoule temperature could be lowered by other methods illustratively including the use of a constant temperature cold bath, use of forced convection of cold air, and thermoelectric cooling.

Figure 4:
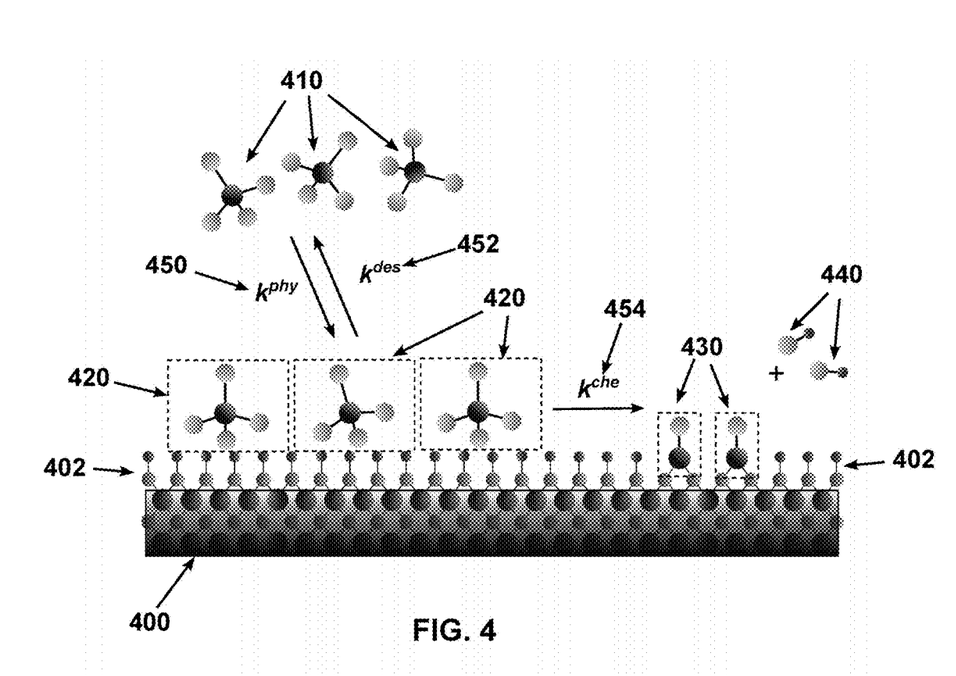
FIG. 4 illustrates a substrate undergoing an atomic layer process of atomic layer deposition (ALD) with the temperature of the precursor ampoule lowered as described in embodiments of the invention.

FIG. 4 illustrates a substrate 400 undergoing an atomic layer process of atomic layer deposition (ALD) with the temperature of the precursor ampoule lowered as described in embodiments of the invention. As shown in FIG. 4, the substrate 400 is at a temperature $T_{sub}$, and has the reactive sites S* 402, upon which the introduced gas phase precursor molecules $A^{gas}$ 410 with precursor partial pressure $P_A$ and precursor pulse duration $t_A$, undergoes a surface reaction. This surface reaction initiates with physisorption of the precursor molecule 410, to form physisorbed species $A^{phy}$ 420. These physisorbed species $A^{phy}$ 420, then may either react further to form chemisorbed surface species $A^{che}$ 430 with evolution of reaction by-products 440; or the $A^{phy}$ 420 may desorb from the substrate surface back as gas phase precursor molecule 410. The chemisorption rate is determined by the rate constants $k^{phy}$ 450, $k^{des}$ 452 and $k^{che}$ 454, representing physisorption, desorption, and chemisorption kinetics respectively. The net surface reaction may be represented as equation 1 as follows:

$$S^* A^{gas} \underset{k_{des}}{\overset{k_{phy}}{\rightleftharpoons}} A^{phy} \xrightarrow{k_{des}} A^{che} \quad \text{Eq. (1)}$$

With steric hindrance from the ligands present on $A^{phy}$ 420 and $A^{che}$ 430 surface species, every $A^{phy}$ and $A^{che}$ surface unit often consumes more than one surface reactive site S* 402. For convenience this shadowing effect is represented with steric hindrance factors $m^{phy}$ (≥1) and $m^{che}$ (≥1) for $A^{phy}$ and $A^{che}$ surface unit respectively.

Using notations [S*], [$A^{phy}$] and [$A^{che}$] to represent the fractional coverage of S*, $A^{phy}$ and $A^{che}$ surface units per unit substrate area, the evolution of [$A^{che}$] with $t_A$ is obtained from equation 2 as follows:

$$\frac{d[A^{phy}]}{dt} = \overbrace{k_{phy} P^A [S^*]}^{Physisorption} - \overbrace{k_{des}[A^{phy}]}^{Desorption} - \overbrace{\frac{d[A^{che}]}{dt}}^{Chemisorption} \quad \text{Eq. (2)}$$

$$\frac{d[A^{che}]}{dt} = k_{che}[A^{phy}] \quad \text{Eq. (3)}$$

$$[S^*] = 1 - m_{phy}[A^{phy}] - m_{che}[A^{che}] \quad \text{Eq. (4)}$$

Combining Eq.(2) and Eq.(4) yields a 2$^{nd}$ order differential equation shown as equation 5 as follows:

$$\frac{d^2[A^{che}]}{dt^2} = k_{che}k_{phy}P^A - (k_{phy}P^A m_{phy} + k_{des} + k_{che})\frac{d[A^{che}]}{dt} - k_{phy}P^A k_{che} m_{che}[A^{che}] \quad \text{Eq. (5)}$$

An analytical solution to Eq.(5) with initial condition $[A^{phy}]=0$, $[A^{che}]=0$ at $t_A=0$ is obtained as follows:

$$[A^{che}] = \frac{1}{m_{che}}\left[1 + \left(\frac{R_2}{R_1-R_2}\right)\cdot\exp(R_1 \cdot t_A) - \left(\frac{R_1}{R_1-R_2}\right)\cdot\exp(R_2 \cdot t_A)\right] \quad \text{Eq. (6)}$$

Where 
$$R_1 = \frac{-(k_{phy}P^A m_{phy} + k_{des} + k_{che}) + \sqrt{(k_{phy}P^A m_{phy} + k_{des} + k_{che})^2 - 4k_{phy}P^A k_{che}m_{che}}}{2}$$

and 
$$R_2 = \frac{-(k_{phy}P^A m_{phy} + k_{des} + k_{che}) - \sqrt{(k_{phy}P^A m_{phy} + k_{des} + k_{che})^2 - 4k_{phy}P^A k_{che}m_{che}}}{2}$$

Figure 5:
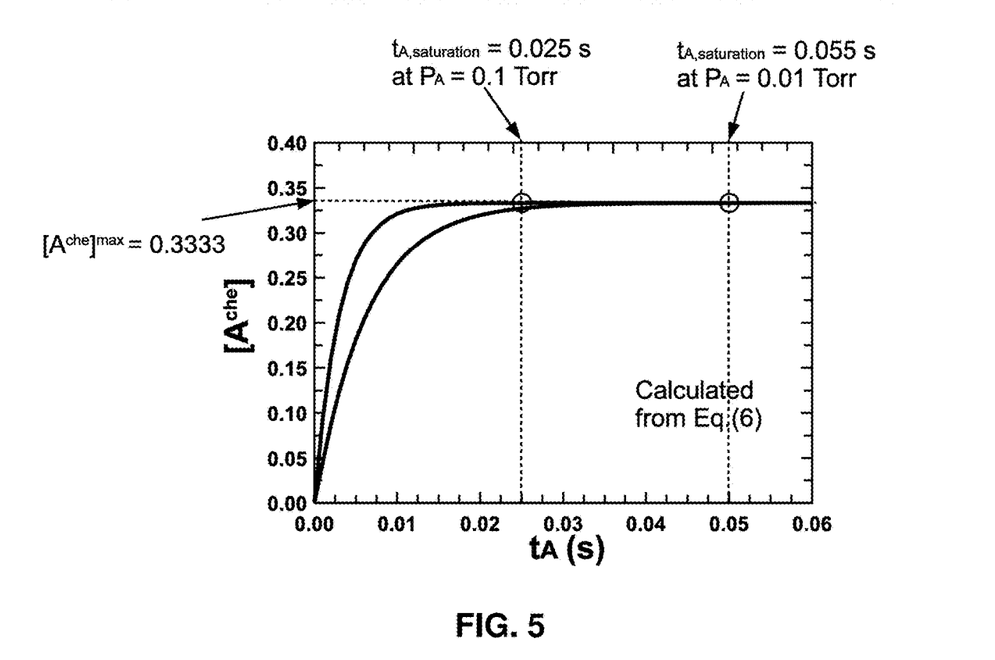
FIG. 5 is a graph showing the chemisorbed surface species $A^{che}$ versus precursor pulse duration to in accordance with embodiments of the invention.

FIG. 5 is a graph showing the chemisorbed surface species $A^{che}$ 430 versus precursor pulse duration $t_A$ that is calculated from Eq.(6) for rate constants $k_{phy}=1\times10^5$ $(\text{Torr}\cdot\text{s})^{-1}$; $k_{des}=5\times10^3$ $s^{-1}$, $k_{che}=5\times10^2$ $s^{-1}$; $m_{phy}=4$; $m_{che}=3$; at $P_A=0.10$ Torr and $P_A=0.01$ Torr. The minimum precursor pulse $t_A$ to attain saturation $[A^{che}]^{max}$ coverage of 0.3333 (=1/$m_{che}$) was observed as $t_{A,saturation}=0.025$ s at $P_A=0.10$ Torr and $t_{A,saturation}=0.055$ s at $P_A=0.01$ Torr respectively.

The total number of precursor molecules impinging on a unit area of the substrate over pulse duration $t_A$ is given by the product $P_A k_{phy} t_A$, and the precursor utilization efficiency ($\eta$) is obtained with equation 7 as follows:

$$\eta = \frac{[A^{che}]^{max}}{P_A k_{phy} t_{A,saturation}} \quad \text{Eq. (7)}$$

Thus for the calculation results shown in the graph of FIG. 5, this utilization efficiency is seen as $\eta=0.13\%$ at $P_A=0.10$ Torr and $\eta=0.61\%$ at $P_A=0.01$ Torr.

Figure 6:
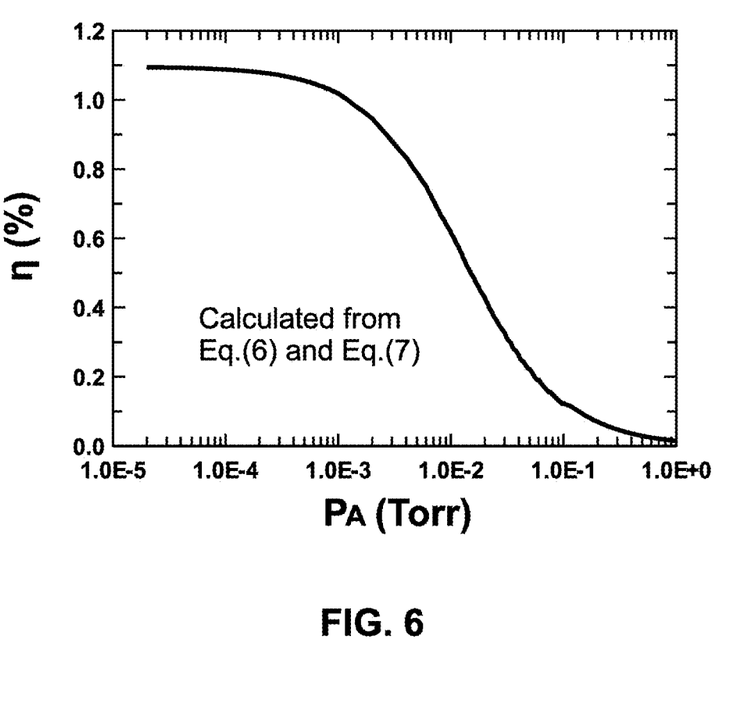
FIG. 6 is a graph of precursor utilization efficiency η versus precursor partial pressure $P_A$ in accordance with embodiments of the invention.

FIG. 6 is a graph of precursor utilization efficiency $\eta$ calculated from Eq.(6) and Eq.(7) at a precursor partial pressure $P_A$ ranging from $2\times10^{-5}$ Torr to 1.0 Torr.

The partial pressure ($P_A$) of gas phase precursor molecules $A^{gas}$ 410 introduced into the ALP reactor that varies with the ampoule temperature ($T_{amp}$) is obtained from Eq.(8) as follows:

$$\log[P_A(torr)] = \alpha - \frac{\beta}{T_{amp}(°C.) + 273.15} \quad \text{Eq. (8)}$$

As can be seen from Eq.(8) where ampoule temperature ($T_{amp}$) is in the denominator that lowering the precursor ampoule temperature ($T_{amp}$) lowers the partial pressure ($P_A$) of the precursor gas phase molecules, and consequently improves precursor utilization efficiency ($\eta$).

Figure 7A:
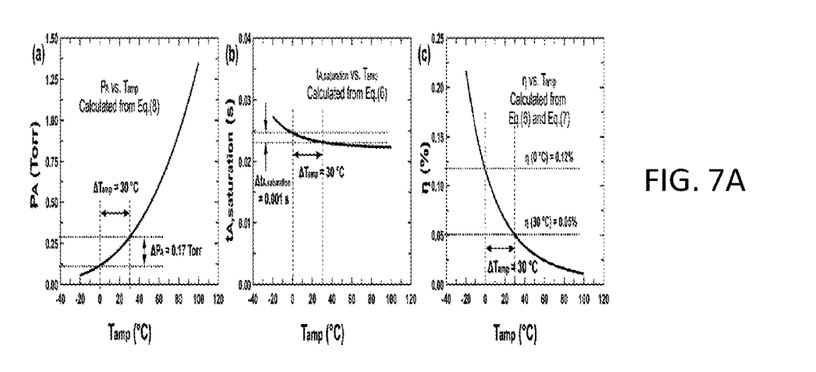
FIG. 7(a) is a graph that shows the calculated partial pressure ($P_A$) using α=7.0 and β=2500 for a $T_{amp}$ in range of −20° C. to 100° C. in accordance with embodiments of the invention.

FIG. 7(a) is a graph that shows the calculated partial pressure ($P_A$) from Eq.(8) using $\alpha=7.0$ and $\beta=2500$ for $T_{amp}$ in range of $-20°$ C. to $100°$ C.

Figure 7B:
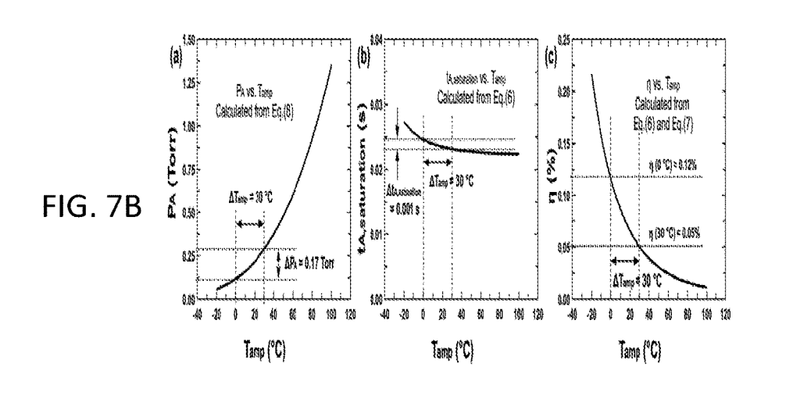
FIG. 7(b) is a graph that shows the minimum precursor pulse duration saturation required to attain saturation coverage $[A^{che}]^{max}$ of the chemisorbed $A^{che}$ in accordance with embodiments of the invention.

FIG. 7(b) is a graph that shows the minimum precursor pulse duration $t_{A,saturation}$ required to attain saturation coverage $[A^{che}]^{max}$ of the chemisorbed $A^{che}$ 430 with surface units calculated from Eq.(6).

Figure 7C:
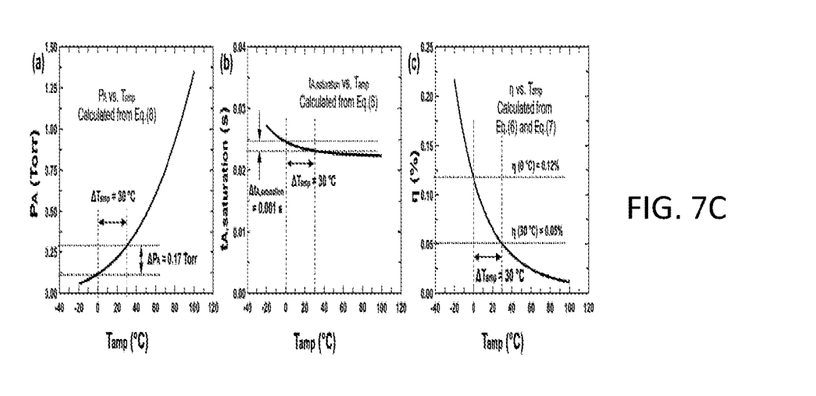
FIG. 7(c) shows the calculated precursor utilization efficiency (η) with lowering of precursor ampoule temperature ($T_{amp}$) in accordance with embodiments of the invention

FIG. 7(c) shows the calculated precursor utilization efficiency ($\eta$) with lowering of precursor ampoule temperature ($T_{amp}$). The precursor utilization efficiency $\eta$ for the illustrated ALD surface reaction of FIG. 4 is calculated from Eq.(6), and Eq.(7).

As seen in FIG. 7(c), a moderate lowering of $T_{amp}$ by $30°$ C. from room temperature (approximately $30°$ C.) to $0°$ C., is seen to increase precursor utilization efficiency $\eta$ from 0.05% to 0.12% (i.e., a relative 2.4 times increase in $\eta$). Interestingly, this increase in efficiency is realized at the cost of a miniscule increase in the required precursor pulse for saturation ($t_{A,saturation}$) of approximately 0.001 s. Clearly the benefits of 2.4 times increase in $\eta$ is significantly higher than the cost of increase in $t_{A,saturation}$ by approximately 0.001 s.

It is to be noted that the calculations presented in FIGS. 7(a)-7(c) are specific to the model parameters $k_{phy}=1\times10^5$ $(\text{Torr}\cdot\text{s})^{-1}$; $k_{des}=5\times10^3$ $s^{-1}$, $k_{che}=5\times10^2$ $s^{-1}$; $m_{phy}=4$; $m_{che}=3$; $\alpha=7.0$ and $\beta=2500$.

Figure 8A:
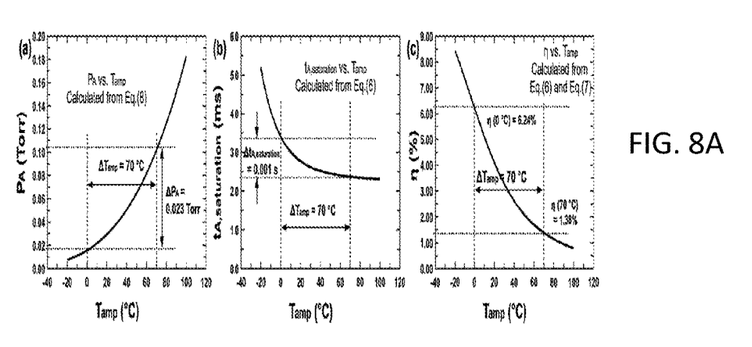
FIG. 8(a) is a graph that shows the calculated partial pressure ($P_A$) using α=5.0 and β=2500 for a $T_{amp}$ in range of −20° C. to 100° C. in accordance with embodiments of the invention.

FIG. 8(a) is a graph that shows the calculated partial pressure ($P_A$) from Eq.(8) using $\alpha=5.0$ and $\beta=2500$ for $T_{amp}$ in range of $-20°$ C. to $100°$ C.

Figure 8B:
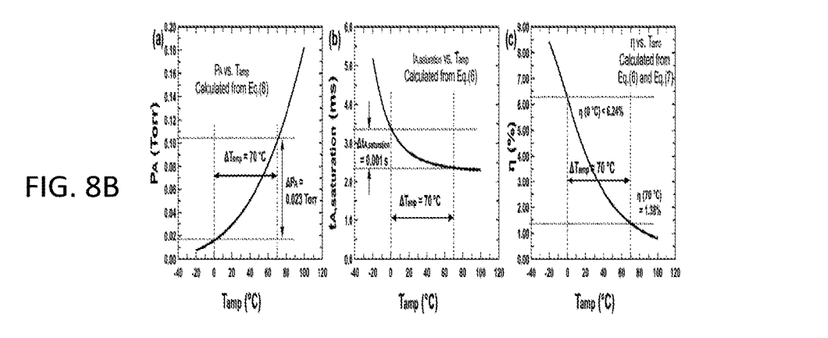
FIG. 8(b) is a graph that shows the minimum precursor pulse duration $t_{A,saturation}$ required to attain saturation coverage $[A^{che}]^{max}$ of the chemisorbed $A^{che}$ in accordance with embodiments of the invention.

FIG. 8(b) is a graph that shows the minimum precursor pulse duration $t_{A,saturation}$ required to attain saturation coverage $[A^{che}]^{max}$ of the chemisorbed $A^{che}$ 430 with surface units calculated from Eq.(6).

Figure 8C:
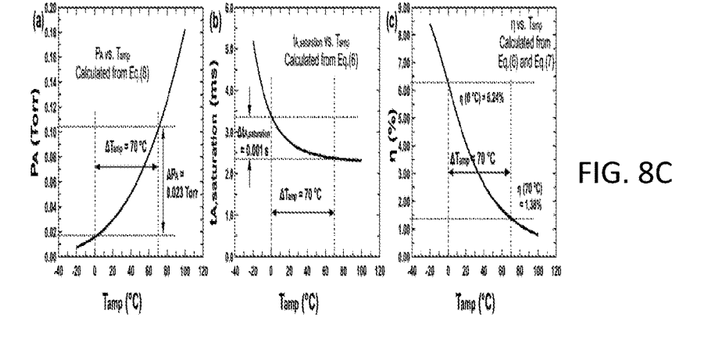
FIG. 8(c) shows the calculated precursor utilization efficiency (η) with lowering of precursor ampoule temperature ($T_{amp}$) in accordance with embodiments of the invention.

FIG. 8(c) shows the calculated precursor utilization efficiency ($\eta$) with lowering of precursor ampoule temperature ($T_{amp}$). The precursor utilization efficiency $\eta$ for the illustrated ALD surface reaction of FIG. 4 is calculated from Eq.(6), and Eq.(7).

As seen in FIG. 8(c), a lowering of $T_{amp}$ by $70°$ C. from approximately $70°$ C. to $0°$ C., is seen to increase precursor utilization efficiency $\eta$ from 1.38% to 6.24% (i.e., a relative 4.5 times increase in $\eta$). Interestingly, this increase in efficiency is realized at the cost of a miniscule increase in the required precursor pulse for saturation ($t_{A,saturation}$) of approximately 0.001 s. Clearly the benefits of 4.5 times increase in $\eta$ is significantly higher than the cost of increase in to $t_{A,saturation}$ by approximately 0.001 s.

It is to be noted that the calculations presented in FIGS. 8(a)-8(c) are specific to the model parameters $k_{phy}=1\times10^5$ $(\text{Torr}\cdot\text{s})^{-1}$; $k_{des}=5\times10^2$ $s^{-1}$, $k_{che}=5\times10^3$ $s^{-1}$; $m_{phy}=4$; $m_{che}=3$; $\alpha=5.0$ and $\beta=2500$.

Model calculations presented in this example are in good agreement with the illustrated examples.

The present invention is further described with respect to the following non-limiting examples. These examples are intended to illustrate specific formulations according to the present invention and should not be construed as a limitation as to the scope of the present invention.

Example 1

Plasma enhanced Atomic Layer Deposition (PEALD) of Silicon Nitride:
Precursor 1: Tris-dimethylamino silane (TDMAS),
Precursor 2: forming gas (FG, with 5% $H_2$ and rest $N_2$) plasma
Substrate temperature: $100°$ C.
ALD cycle parameters=0.01 s TDMAS pulse—10 s purge—10 s FG plasma exposure—10 s purge
With ampoule at room temperature ($T_{amp}$ approximately $25°$ C.)
Self-limiting growth per cycle (GPC)=0.035±0.001 nm/cycle.
Number of chemisorbed TDMAS molecules=$1.551\times10^{14}$ $cm^{-2}$ $cycle^{-1}$.
Number of TDMAS molecules introduced=$4.226\times10^{16}$ $cm^{-2}$ $cycle^{-1}$.
TDMAS utilization efficiency $\eta=0.367\%$
With lowering $T_{amp}$ from approximately $25°$ C. to approximately $5°$ C., Self-limiting growth per cycle (GPC)=0.035±0.001 nm/cycle.
Number of chemisorbed TDMAS molecules=1.551×10$^{14}$ cm$^{-2}$ cycle$^{-1}$.
Number of TDMAS molecules introduced=0.845×10$^{16}$ cm$^{-2}$ cycle$^{-1}$.
TDMAS utilization efficiency η=1.835%

Lowering of T$_{amp}$ for TDMAS precursor from approximately 25° C. to approximately 5° C., the precursor utilization efficiency of TDMAS in SiN PEALD process increased from 0.367% to 1.835% (a 5× increase in η).

Example 2

Plasma enhanced Atomic Layer Deposition (PEALD) of Zinc Oxide
Precursor 1: Diethyl zinc (DEZ),
Precursor 2: Oxygen (O) plasma
Substrate temperature: 50° C.
ALD cycle parameters=0.06 s DEZ pulse—8 s purge—5 s O plasma exposure—5 s purge
With ampoule at room temperature (T$_{amp}$ approximately 25° C.)
Self-limiting growth per cycle (GPC)=0.107±0.001 nm/cycle.
Number of chemisorbed DEZ molecules=4.441×10$^{14}$ cm$^{-2}$ cycle$^{-1}$.
Number of DEZ molecules introduced=5.796×10$^{16}$ cm$^{-2}$ cycle$^{-1}$.
DEZ utilization efficiency η=0.766%
With lowering T$_{amp}$ from approximately 25° C. to approximately 2° C.,
Self-limiting growth per cycle (GPC)=0.107±0.001 nm/cycle.
Number of chemisorbed DEZ molecules=4.441×10$^{14}$ cm$^{-2}$ cycle$^{-1}$.
Number of DEZ molecules introduced=0.552×10$^{16}$ cm$^{-2}$ cycle$^{-1}$.
DEZ utilization efficiency η=8.046%

Lowering of T$_{amp}$ for DEZ precursor from approximately 25° C. to approximately 2° C., the precursor utilization efficiency of DEZ in ZnO PEALD process increased from 0.766% to 8.046% (a 10.5× increase in η).

Example 3

Plasma enhanced Atomic Layer Deposition (PEALD) of Aluminum Oxide
Precursor 1: Trimethyl Aluminum (TMA),
Precursor 2: Oxygen (O) plasma
Substrate temperature: 200° C.
ALD cycle parameters=0.04 s TMA pulse—8 s purge—10 s O plasma exposure—12 s purge
With ampoule at room temperature (T$_{amp}$ approximately 25° C.)
Self-limiting growth per cycle (GPC)=0.113±0.001 nm/cycle.
Number of chemisorbed TMA molecules=5.292×10$^{14}$ cm$^{-2}$ cycle$^{-1}$.
Number of TMA molecules introduced=2.128×10$^{16}$ cm$^{-2}$ cycle$^{-1}$.
TMA utilization efficiency η=2.49%
With lowering T$_{amp}$ from approximately 25° C. to approximately 2° C.,
Self-limiting growth per cycle (GPC)=0.113±0.001 nm/cycle.
Number of chemisorbed TMA molecules=5.292×10$^{14}$ cm$^{-2}$ cycle$^{-1}$.
Number of TMA molecules introduced=0.473×10$^{16}$ cm$^{-2}$ cycle$^{-1}$.
TMA utilization efficiency η=11.19%

Lowering of T$_{amp}$ for TMA precursor from approximately 25° C. to approximately 2° C., the precursor utilization efficiency of TMA in Al$_2$O$_3$ PEALD process increased from 2.49% to 11.19% (a 4.5× increase in η).

Although specific embodiments for example precursor delivery systems, and method of cooling have been described, such embodiments are merely to illustrate the principles of the invention. As a person skilled in the art will recognize from the previous detailed description and from the figures and claims, modifications and changes can be made to the preferred embodiments of the invention without departing from the scope of this invention defined in the following claims.

The invention claimed is:

1. A method for efficient precursor utilization in an atomic layer process comprising:
   providing an ampoule containing precursor molecules in a gaseous form;
   lowering the temperature of the ampoule by 20 to 70° C. such that the partial pressure (P$_A$) of the precursor gaseous molecules is maintained below 1 Torr; and
   delivering precursor molecules from said precursor ampoule at said lower temperature into an atomic layer process reactor;
   wherein a precursor utilization efficiency is greater than 1%.

2. The method of claim 1 wherein said precursor molecules are a reactant for said atomic layer process, contained within said precursor ampoule.

3. The method of claim 1 wherein said atomic layer process reactor is a controlled enclosure accommodating one or more substrates whereon the delivered precursor molecules react.

4. The method of claim 1 wherein said lowering of the temperature is to less than an ambient temperature.

5. The method of claim 1 wherein said delivering of the precursor molecules into said atomic layer process reactor further comprises a repeating sequence of individual precursor pulses.

6. The method of claim 1 wherein the said atomic layer process is assisted by plasma.

7. The method of claim 1 wherein said atomic layer process is assisted by photo-excitation.

8. The method of claim 1 wherein the said atomic layer process is an atomic layer deposition.

9. The method of claim 1 wherein the said atomic layer process is an atomic layer etching.

10. The method of claim 1 further comprising an AxBAxB . . . or AxByAxBy . . . pulsed atomic layer process.

11. The method of claim 1 further comprising introducing dopants in thin films grown by atomic layer deposition.

* * * * *